(12) United States Patent
Bhagavatheeswaran et al.

(10) Patent No.: US 8,094,769 B2
(45) Date of Patent: Jan. 10, 2012

(54) PHASE-LOCKED LOOP SYSTEM WITH A PHASE-ERROR SPREADING CIRCUIT

(75) Inventors: Gayathri A. Bhagavatheeswaran, Austin, TX (US); Lipeng Cao, Austin, TX (US); Hector Sanchez, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 740 days.

(21) Appl. No.: 12/180,166

(22) Filed: Jul. 25, 2008

(65) Prior Publication Data

US 2010/0020910 A1 Jan. 28, 2010

(51) Int. Cl.
*H03D 3/24* (2006.01)
(52) U.S. Cl. ........ 375/376; 375/371; 375/354; 375/327; 375/316; 375/294; 375/215
(58) Field of Classification Search .................. 375/376, 375/371, 354, 327, 316, 294, 215
See application file for complete search history.

(56) References Cited

U.S. PATENT DOCUMENTS

| | | | | |
|---|---|---|---|---|
| 5,075,640 A * | 12/1991 | Miyazawa | ...................... | 331/10 |
| 5,375,148 A * | 12/1994 | Parker et al. | .................. | 375/376 |
| 5,631,587 A | 5/1997 | Co et al. | | |
| 5,831,483 A * | 11/1998 | Fukuda | ........................... | 331/17 |
| 6,133,770 A * | 10/2000 | Hasegawa | ..................... | 327/156 |
| 6,300,838 B1 * | 10/2001 | Kelkar | ............................ | 331/17 |
| 6,710,665 B2 | 3/2004 | Maneatis | | |
| 2003/0011437 A1 * | 1/2003 | Ozawa | .............................. | 331/2 |
| 2006/0057811 A1 | 3/2006 | Chou et al. | | |
| 2007/0229127 A1 * | 10/2007 | Tirumalai et al. | ............. | 327/156 |
| 2008/0172193 A1 * | 7/2008 | Rhee et al. | ....................... | 702/69 |
| 2008/0191746 A1 * | 8/2008 | Friedman et al. | ................ | 327/5 |

FOREIGN PATENT DOCUMENTS

| | | |
|---|---|---|
| WO | 03098258 A1 | 11/2003 |
| WO | 2004034557 A2 | 4/2004 |
| WO | 2004034587 A1 | 4/2004 |
| WO | 2004086408 A1 | 10/2004 |
| WO | 2005109649 A1 | 11/2005 |
| WO | 2006107458 A1 | 10/2006 |

\* cited by examiner

*Primary Examiner* — Kenneth Lam
(74) *Attorney, Agent, or Firm* — Charles Bergere

(57) ABSTRACT

A phase-locked loop (PLL) system including a phase-frequency detector for generating an up signal or a down signal based on a phase difference between a reference clock and a feedback clock is provided. The PLL system further includes a phase-error spreading circuit for generating phase-spread pulses based on a relationship between a first time attribute of the up signal or the down signal and a second time attribute of the phase-spread pulses. The PLL system further includes a voltage-controlled oscillator (VCO) for generating a VCO clock based on the phase-spread pulses. The PLL system may also include a charge pump that generates a pumping signal based on the phase-spread pulses.

5 Claims, 8 Drawing Sheets

PHASE-LOCKED LOOP SYSTEM WITH A PHASE-ERROR SPREADING CIRCUIT

BACKGROUND

1. Field

This disclosure relates generally to phase-locked loop systems, and more specifically, to a phase-locked loop system including a phase-error spreading circuit.

2. Related Art

In many systems, phase-locked loop (PLL) systems are employed to generate a reliable clock by determining a phase difference between a reference clock and a feedback clock. The phase difference between the reference clock and the feedback clock is typically converted into an up signal or a down signal, which are coupled to a charge pump. The charge pump produces signals that can be used to control the output of a voltage controlled oscillator (VCO). A clock signal derived from the VCO clock is then used as the feedback clock. The goal of the PLL is to reduce the phase difference between the reference clock and the feedback clock. With the continuing reduction in feature size of the components used to manufacture the various blocks of the PLL and other advances in system design, the PLLs need to satisfy very stringent operating parameters, such as jitter.

Traditional approaches to satisfy these stringent operating parameters, including jitter have not been tightly controllable. For example, in typical PLL systems, phase error is measured only at the positive edge of the reference clock. Any phase error correction is thus made every reference clock cycle only. This delay in effecting phase correction results in phase jitter.

Accordingly, there is a need for circuits and methods that can be used to better manage jitter, such as a phase-error spreading circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
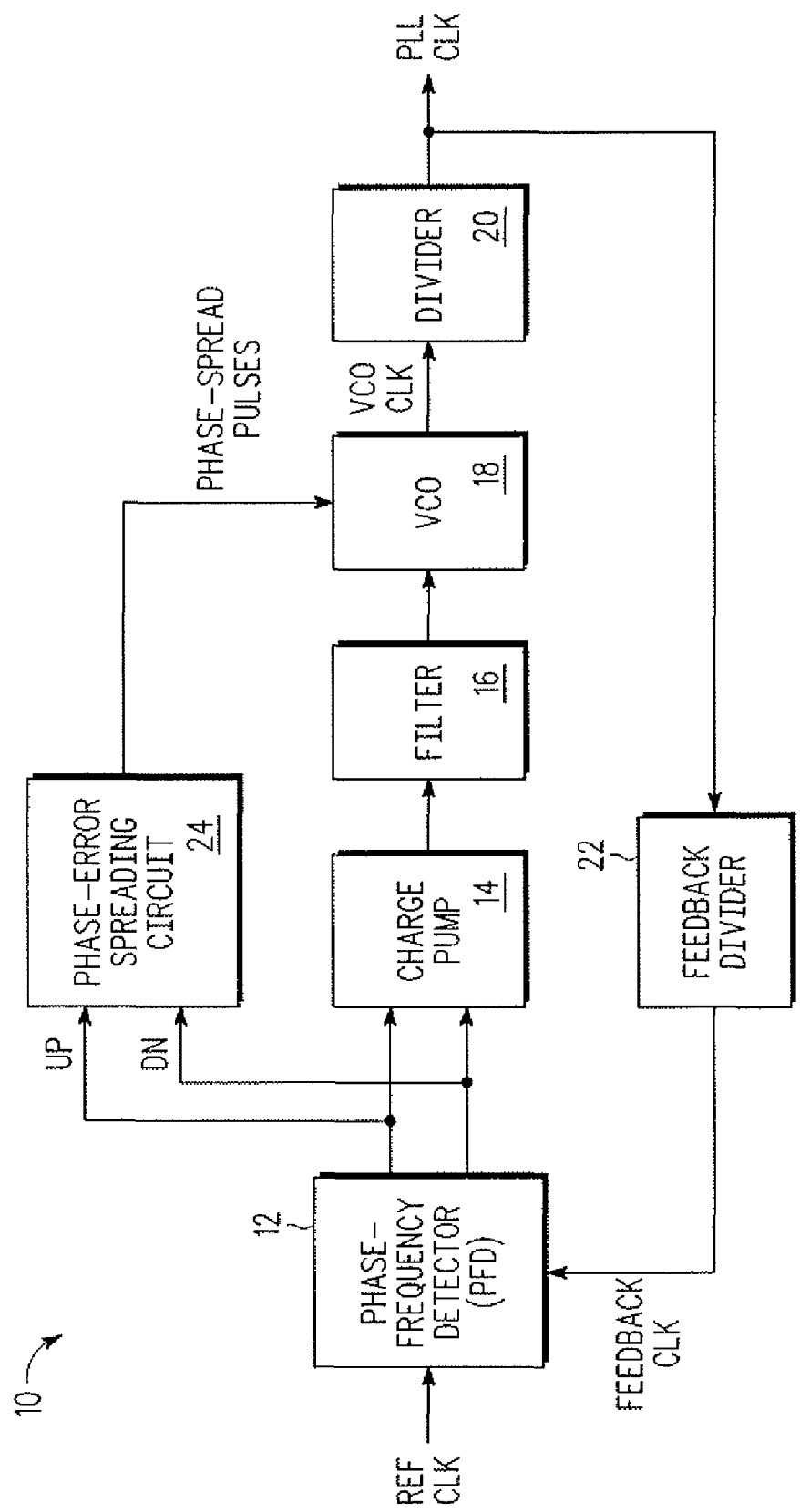
FIG. 1 is an exemplary block diagram of a phase-locked loop (PLL) 10. PLL 10 may include

In one aspect, a phase-locked loop (PLL) system including a phase-frequency detector for generating an up signal or a down signal based on a phase difference between a reference clock and a feedback clock is disclosed. The PLL system further includes a phase-error spreading circuit for generating phase-spread pulses based on a relationship between a first time attribute of the up signal or the down signal and a second time attribute of the phase-spread pulses. The PLL system further includes a voltage-controlled oscillator (VCO) for generating a VCO clock based on the phase-spread pulses.

In another aspect, a phase-locked loop (PLL) system including a phase-frequency detector for generating an up signal or a down signal based on a phase difference between a reference clock and a feedback clock. The PLL system further includes a phase-spread pulses generator for generating phase-spread pulses based on a digital indicia of the phase difference between the reference clock and the feedback clock. The PLL system further includes a charge pump for generating a pumping signal based on the phase-spread pulses.

In yet another aspect, a phase-locked loop (PLL) system including a phase-frequency detector for generating an up signal or a down signal based on a phase difference between a reference clock and a feedback clock is provided. The PLL system further includes a phase-error spreading circuit for generating phase-spread pulses based on a relationship between a first time attribute of the up signal or the down signal and a second time attribute of the phase-spread pulses. The PLL system further includes a charge pump for generating a pumping signal based on the phase-spread pulses. The PLL system further includes a voltage-controlled oscillator (VCO) for generating a VCO clock based on the phase-spread pulses and the pumping signal.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 is an exemplary block diagram of a phase-locked loop (PLL) 10. PLL 10 may include a phase-frequency detector (PFD) 12, a charge pump 14, a filter 16, a voltage controlled oscillator (VCO) 18, a divider 20, feedback divider 22, and a phase-error spreading circuit 24. PFD 12 may generate an up signal (UP, for example) or a down signal (DN, for example) based on a phase difference between a reference clock (REF CLK, for example) and a feedback clock (FEEDBACK CLK, for example). The up signal and the down signal besides being fed to charge pump 14 may also be fed to phase-error spreading circuit 24. Charge pump 14 may generate a voltage in response to the up signal and the down signal, which may be smoothed by filter 16 and fed to a voltage controlled oscillator (VCO) 18. VCO 18 may generate clock VCO CLK, which may be divided using divider 20, resulting in PLL CLK. The clock output of PLL 10 may be fed back to PFD 12 and may be divided using feedback divider 22 prior to being fed as feedback clock FEEDBACK CLK. Consistent with general operating principles associated with a PLL, PLL 10 may generate a clock that is as close as possible to reference clock REF CLK based on the negative loop feedback associated with PLL 10. An output of phase-error spreading circuit 24 may be coupled to VCO 18, such that PHASE-SPREAD PULSES may be provided to VCO 18. By way of example, PHASE-SPREAD PULSES may be generated by phase-error spreading circuit 24 based on a relationship between a first time attribute of UP SIGNAL or DOWN SIGNAL and a second time attribute of the PHASE-SPREAD PULSES. Although FIG. 1 shows specific components arranged in a specific manner, in other embodiments fewer or more components, arranged differently, may also be used.

Figure 2:
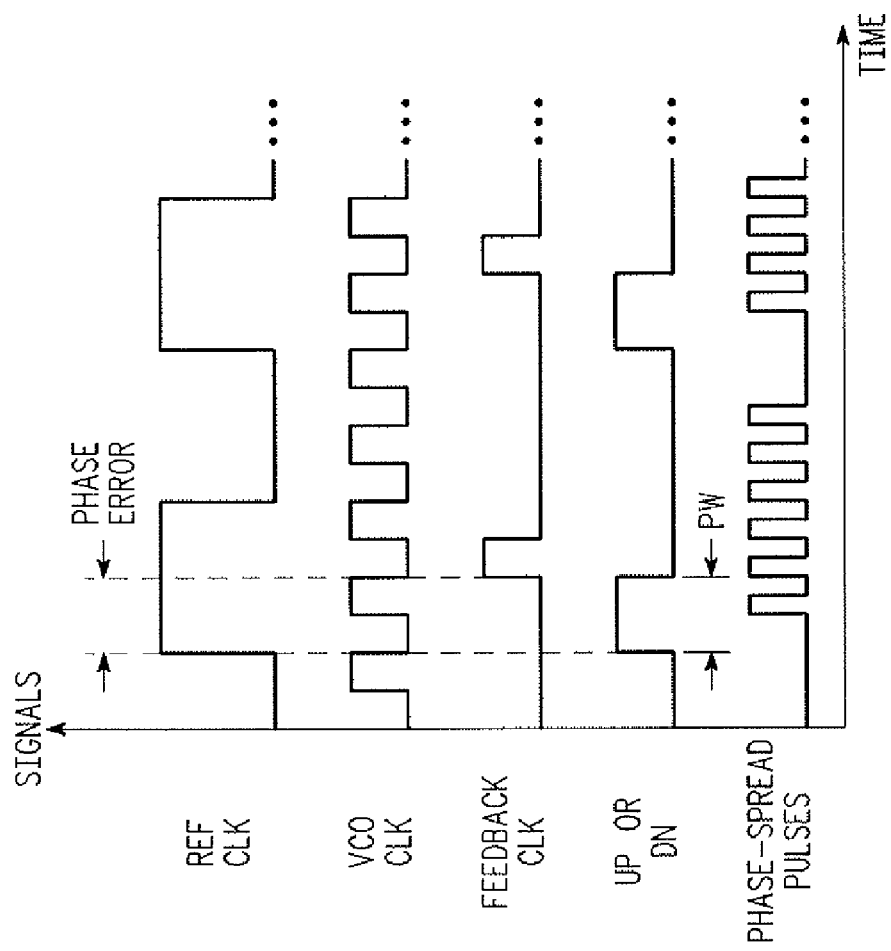
FIG. 2 is an exemplary timing diagram for signals associated with the PLL of FIG. 1.

FIG. 2 is an exemplary timing diagram for signals associated with the PLL 10 of FIG. 1. Reference clock REF CLK may be generated using an appropriate source, such as a crystal oscillator or another clock generator. The phase difference between the reference clock REF CLK and the VCO clock may represent a phase error. In response to which UP or DN signal may be generated. Based on a pulse width (PW) of the UP or DN signal PHASE-SPREAD PULSES may be generated by phase-error spreading circuit 24. In one embodiment, phase error spreading circuit 24 may measure a size of the UP or DN signal, which is representative of the phase error and then output a value representative of the phase error. By way of example, the pulse width may be measured using a buffer based delay chain or an equivalent circuit. The output from the delay chain may be stored in thermometer register, for example. A pulse generator may then generate PHASE-SPREAD pulses based on the output of the thermometer register, for example.

Figure 3:
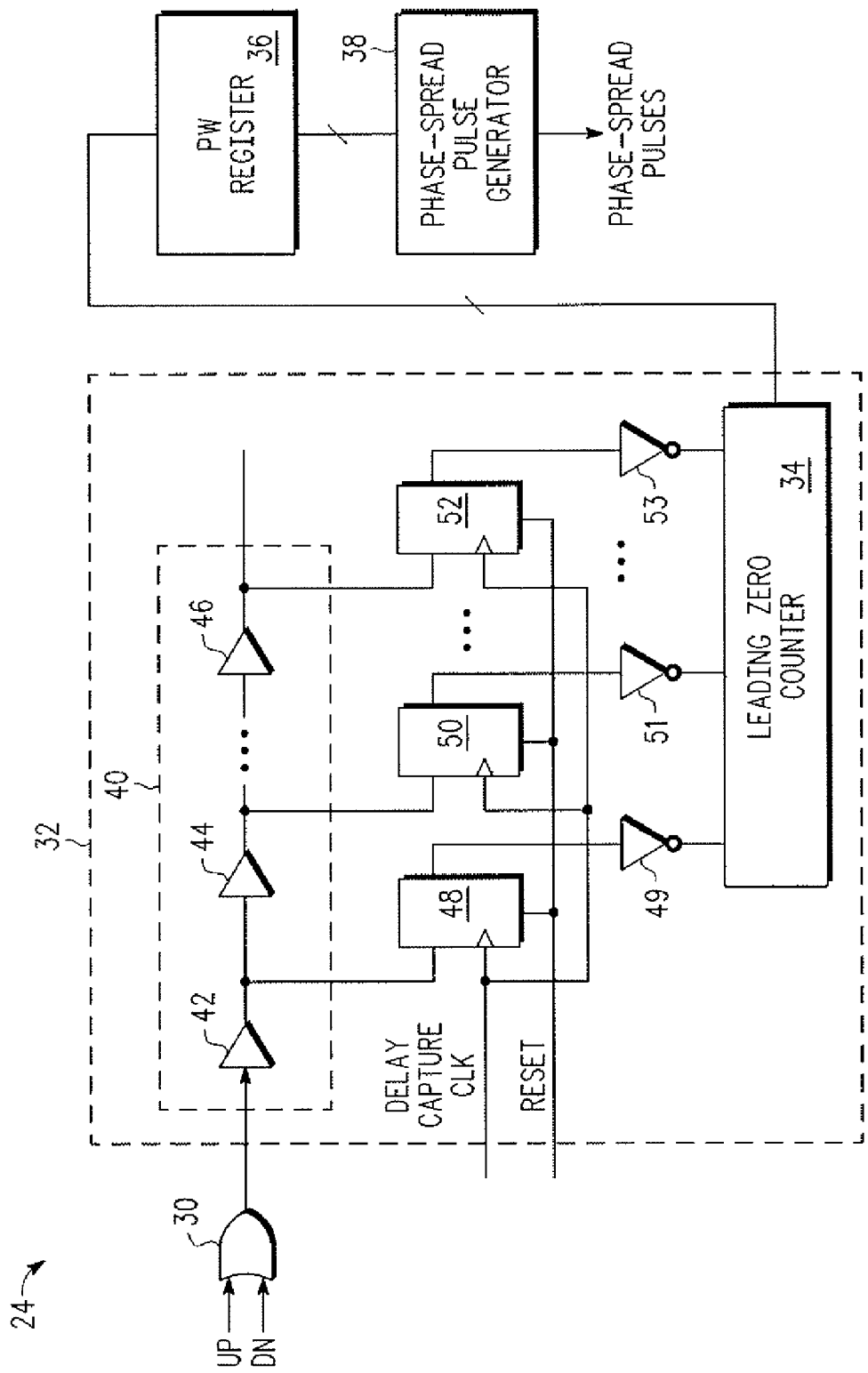
FIG. 3 is an exemplary diagram of a phase-error spreading circuit.

FIG. 3 is an exemplary diagram of a phase-error spreading circuit 24. Phase-error spreading circuit 24 may include an OR gate 30, a timing relationship analysis module 32, a pulse width (PW) register 36, and a phase-spread pulse generator 38. OR gate 30 may receive both the UP signal and the DN signal and may output either one of them to timing relationship analysis module 32. By way of example, timing relationship analysis module 32 may include a weighted delay chain 40, flip flops 48, 50, and 52, and leading zero counter 34. Weighted delay chain 40 may include a series of buffers 42, 44, and 46, which may be coupled in a manner shown in FIG. 3. Flip flops 48, 50, and 52 may generate a 0 or 1 as an output. In operation, UP signal and DN signal are subjected to an OR operation resulting in a single input pulse. This input pulse is subjected to delays as it makes it way across weighted delay chain 40. At each output node corresponding to each buffer (for example, buffers 42, 44, and 46), the input pulse has been delayed in proportion to the number of buffers it has encountered so far. The delayed input pulse from the output of each buffer is compared with the DELAY CAPTURE CLOCK. A result of the comparison is then stored in a respective flip flop. If both the delayed input pulse and the DELAY CAPTURE CLOCK have a high value then the respective flip flop stores a value of 1. Otherwise, the respective flip flop stores a value of 0. The output values from flip flops 48, 50, and 52 may be inverted using inverters 49, 51, and 53, respectively. Leading zero counter 34 may provide a binary count of the leading 0 values. The binary count may be stored in PW register 36. By way of example, the timing relationship analysis module in effect generates a "1" or "0" output, which is representative of the time duration of phase error pulse. By way of example, in other words, the binary count represents the number of phase-spread pulses. Although FIG. 3 shows a leading zero counter, a leading one counter may also be used. In addition, although FIG. 3 shows specific components arranged in a specific manner, in other embodiments fewer or more components, arranged differently, may also be used.

Figure 4:
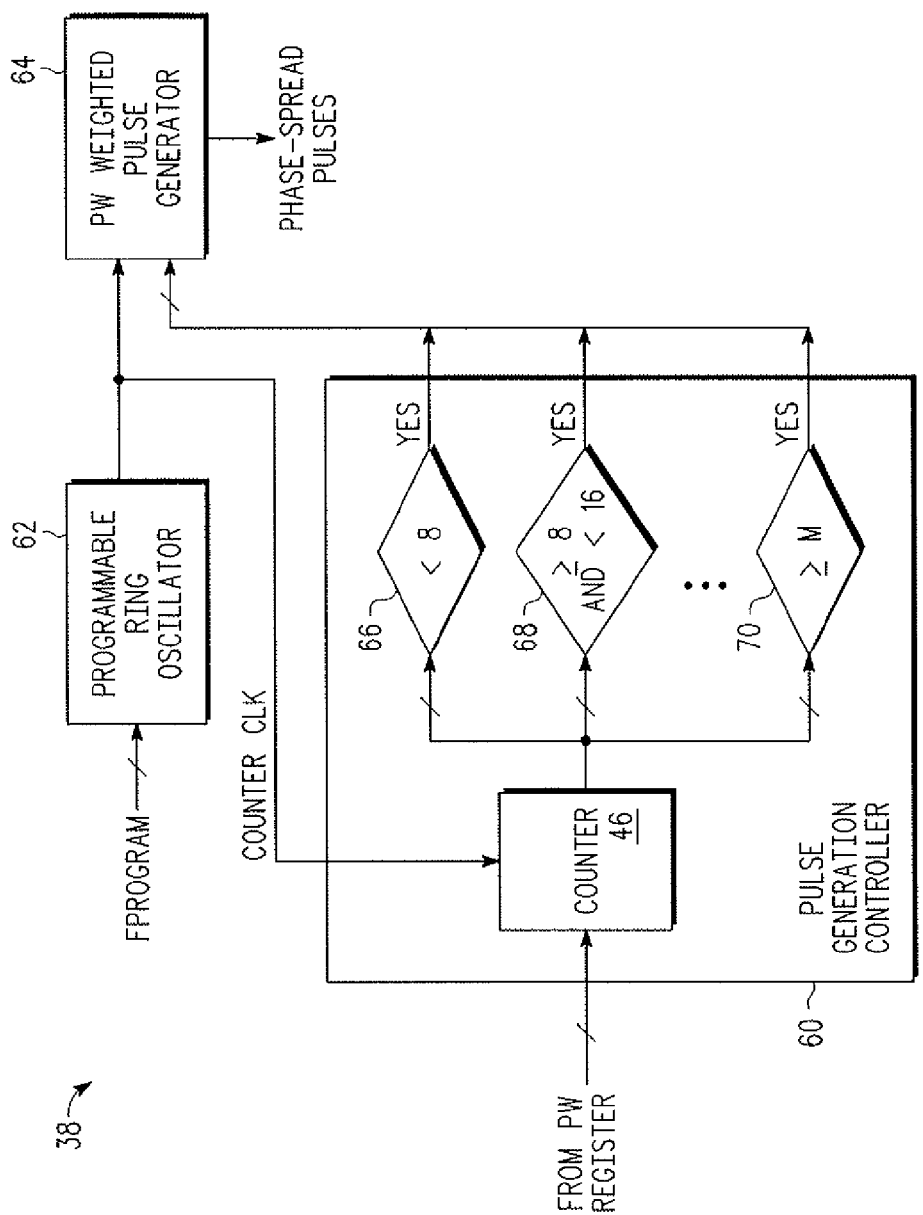
FIG. 4 is an exemplary diagram of a phase-spread pulse generator.

FIG. 4 is an exemplary diagram of a phase-spread pulse generator 38. By way of example, phase-spread pulse generator 38 may include a pulse generation oscillator 60, a programmable ring oscillator 62, and a PW weighted pulse generator 64. In response to a signal, such as FPROGRAM, programmable ring oscillator 62 may generate a clock, such as COUNTER CLK. Programmable ring oscillator 62 may be implemented using a series of inverters or other components. Pulse generation controller 60 may include a counter 46 and logic blocks 66, 68, and 70, which may be used to compare an output of counter 46 with a particular value or a range of values. Thus, for example, if the count is less than 8, then, a signal may be sent from logic block 66 to PW weighted pulse generator 64. If the count is greater than or equal to 8, but is less than 16, then a signal may be sent from logic block 68 to PW weighted pulse generator 64. Similarly, if the count is greater than or equal to M, then a signal may be sent from logic block 70 to PW weighted pulse generator 64. Although FIG. 4 shows logic blocks that can compare counter output to a value up to M, where M is an integer greater than zero, pulse generation controller 60 may include additional or fewer logic blocks. In addition, the functionality associated with pulse generation counter may be implemented in other ways. In response to the clock from programmable ring oscillator 62 and the signals from pulse generation controller 60, PW weighted pulse generator 64 may generate a series of pulse, referred to as phase-spread pulses. Although FIG. 4 shows specific components arranged in a specific manner, in other embodiments fewer or more components, arranged differently, may also be used.

Figure 5:
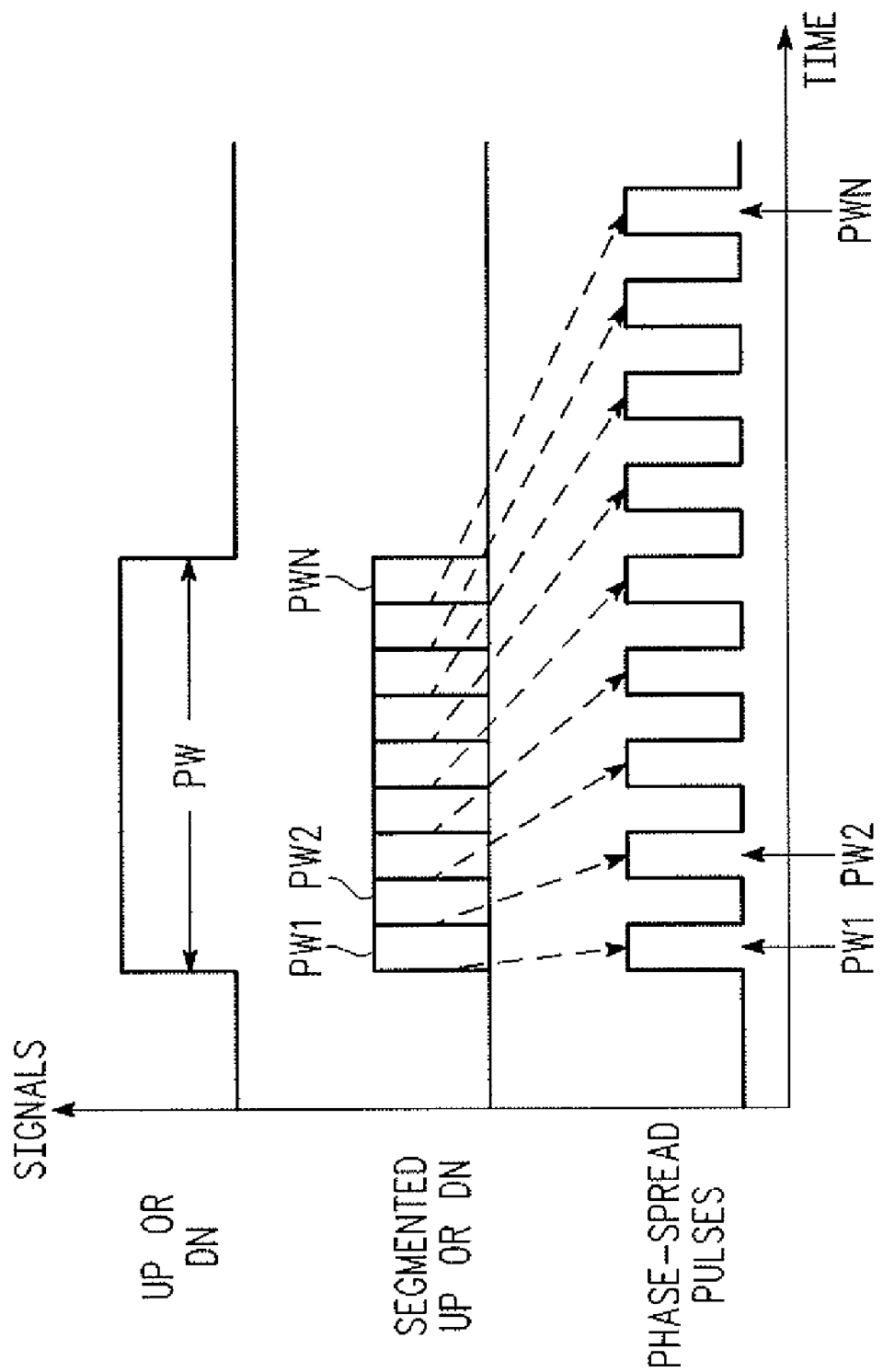
FIG. 5 is an exemplary timing diagram for signals associated with the phase-spread pulse generator of FIG. 4.
Figure 6:
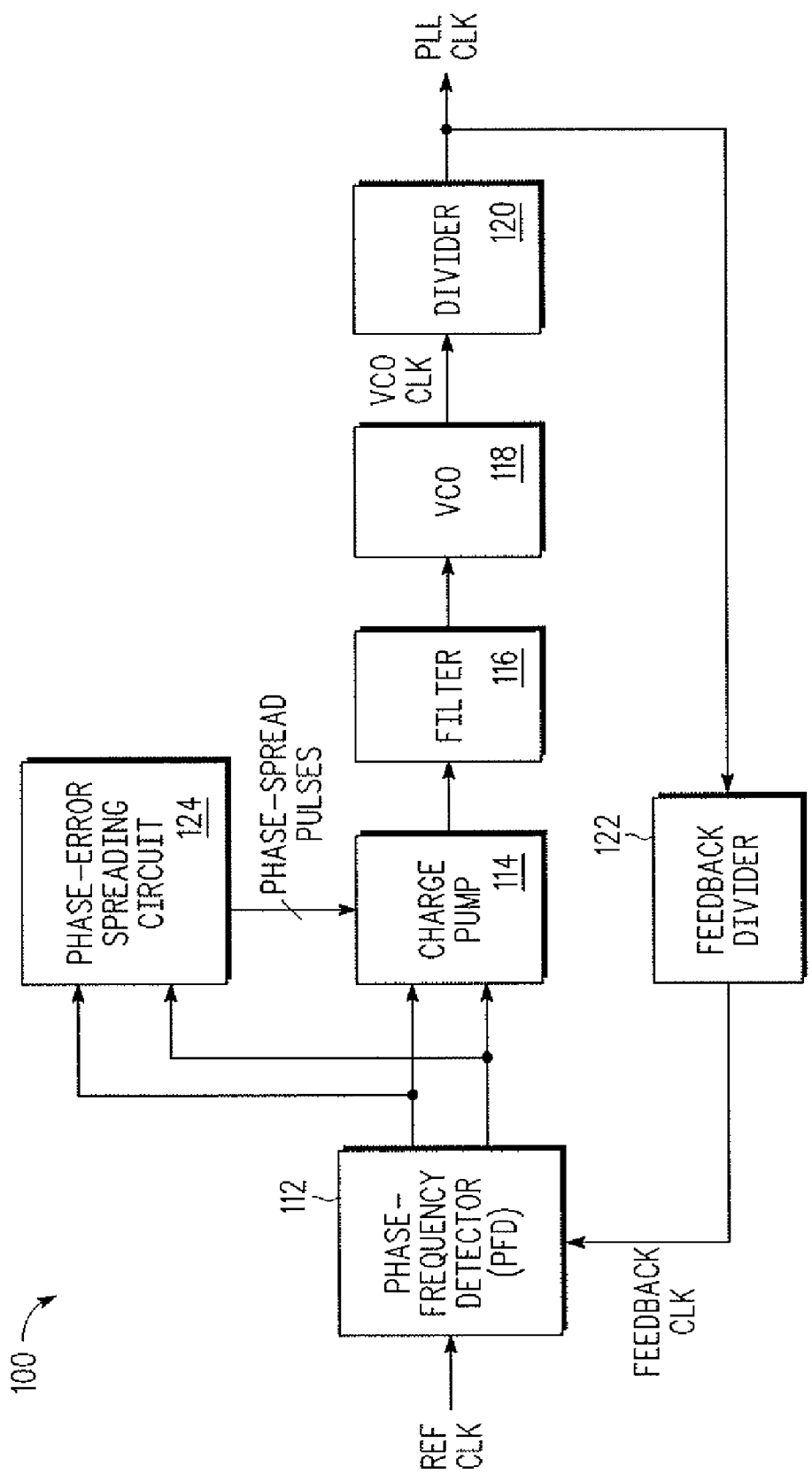
FIG. 6 is an exemplary diagram of a second embodiment of a phase-locked loop (PLL)

FIG. 5 is an exemplary timing diagram for signals associated with the phase-spread pulse generator 38 of FIG. 4. As shown in FIG. 6, phase-spread pulse generator 38 segments UP or DN signals in shorter time spans, such that phase-spread pulses, such as PW1, PW2 . . . PWN can be generated. Thus, for example, UP or DN signal may have pulse width of PW, which is segmented resulting in phase-spread pulses.

FIG. 6 is an exemplary diagram of a second embodiment of a phase-locked loop (PLL) 100. PLL 100 may include a phase-frequency detector (PFD) 112, a charge pump 114, a filter 116, a voltage controlled oscillator (VCO) 118, a divider 120, feedback divider 122, and a phase-error spreading circuit 124. PFD 112 may generate an up signal (UP, for example) or a down signal (DN, for example) based on a phase difference between a reference clock (REF CLK, for example) and a feedback clock (FEEDBACK CLK, for example). The up signal and the down signal besides being fed to charge pump 114 may also be fed to phase-error spreading circuit 124. Charge pump 114 may generate a voltage in response to the up signal and the down signal, which may be smoothed by filter 16 and fed to a voltage controlled oscillator (VCO) 118. VCO 118 may generate clock VCO CLK, which may be divided using divider 120, resulting in PLL CLK. The clock output of PLL 100 may be fed back to PFD 112 and may be divided using feedback divider 122 prior to being fed as feedback clock FEEDBACK CLK. Consistent with general operating principles associated with a PLL, PLL 100 may generate a clock that is as close as possible to reference clock REF CLK based on the negative loop feedback associated with PLL 100. An output of phase-error spreading circuit 124 may be coupled to charge pump 114, such that PHASE-SPREAD PULSES may be provided to charge pump 114. By way of example, PHASE-SPREAD PULSES may be generated by phase-error spreading circuit 124 based on a relationship between a first time attribute of UP SIGNAL or DOWN SIGNAL and a second time attribute of the PHASE-SPREAD PULSES. By providing the phase-spread pulses to charge pump 114, the voltage generated by charge pump 114 is made more responsive to changes in phase error. Although FIG. 6 shows specific components arranged in a specific manner, in other embodiments fewer or more components, arranged differently, may also be used.

Figure 7:
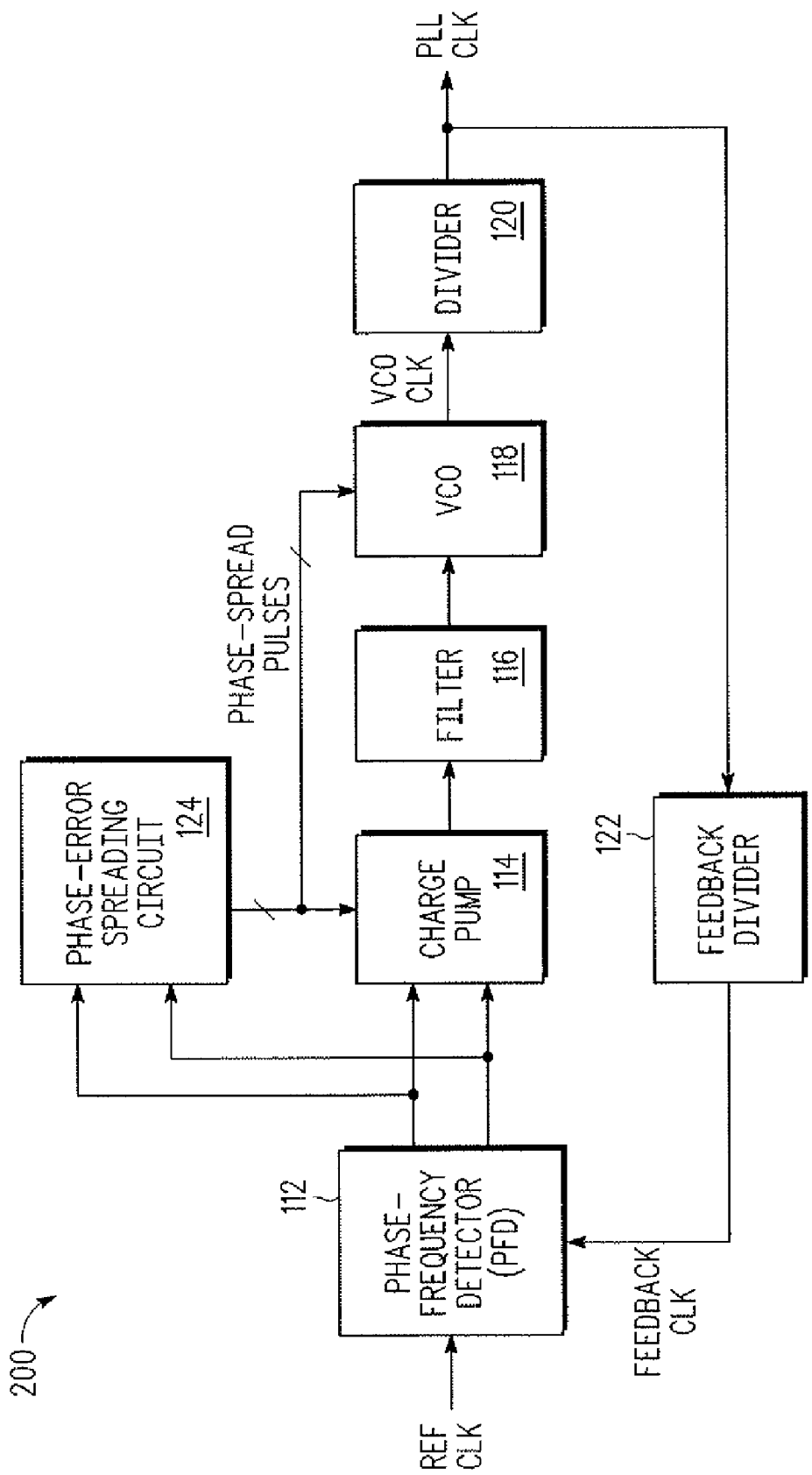
FIG. 7 is an exemplary diagram of a third embodiment of a phase-locked loop (PLL)

FIG. 7 is an exemplary diagram of a third embodiment of a phase-locked loop (PLL) 200. PLL 200 may include a phase-frequency detector (PFD) 112, a charge pump 114, a filter 116, a voltage controlled oscillator (VCO) 118, a divider 120, feedback divider 122, and a phase-error spreading circuit 124. PFD 112 may generate an up signal (UP, for example) or a down signal (DN, for example) based on a phase difference between a reference clock (REF CLK, for example) and a feedback clock (FEEDBACK CLK, for example). The up signal and the down signal besides being fed to charge pump 114 may also be fed to phase-error spreading circuit 124. Charge pump 114 may generate a voltage in response to the up signal and the down signal, which may be smoothed by filter 116 and fed to a voltage controlled oscillator (VCO) 118. VCO 118 may generate clock VCO CLK, which may be divided using divider 120, resulting in PLL CLK. The clock output of PLL 200 may be fed back to PFD 112 and may be divided using feedback divider 122 prior to being fed as feedback clock FEEDBACK CLK. Consistent with general operating principles associated with a PLL, PLL 200 may generate a clock that is as close as possible to reference clock REF CLK based on the negative loop feedback associated with PLL 200. An output of phase-error spreading circuit 124 may be coupled to both charge pump 114 and VCO 118, such that PHASE-SPREAD PULSES may be provided to both charge pump 114 and VCO 18. By way of example, PHASE-SPREAD PULSES may be generated by phase-error spreading circuit 24 based on a relationship between a first time attribute of UP SIGNAL or DOWN SIGNAL and a second time attribute of the PHASE-SPREAD PULSES. By providing the phase-spread pulses to charge pump 114, the voltage generated by charge pump 114 is made more responsive to changes in phase error. Similarly, by providing the phase-spread pulses to VCO 118, the change of frequency to a given phase error is spread over time. In this embodiment, the phase-spread pulses are provided to both charge pump 114 and VCO 118. Although FIG. 8 shows specific components arranged in a specific manner, in other embodiments fewer or more components, arranged differently, may also be used.

Figure 8:
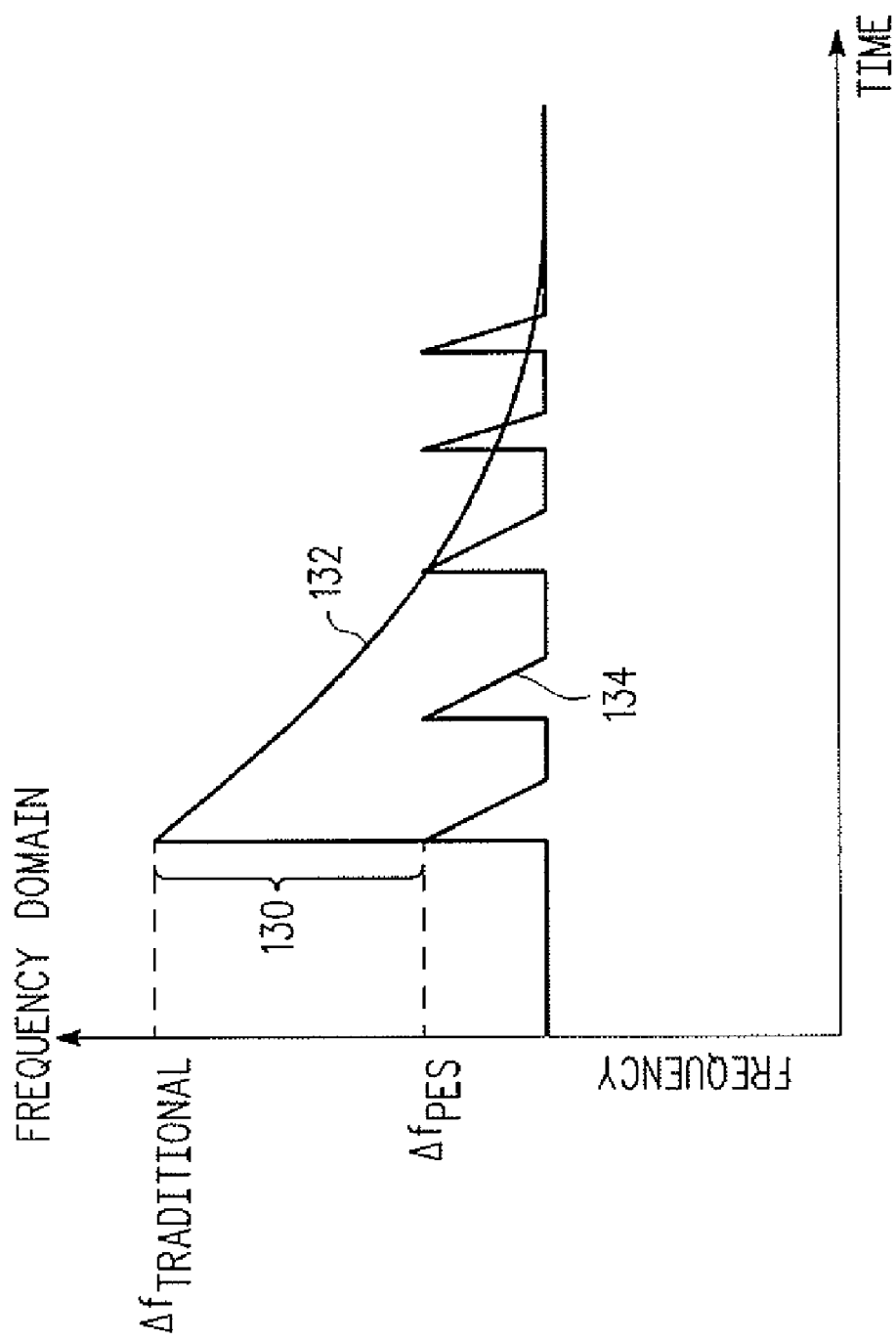
FIG. 8 is a frequency versus time plot showing the reduction in jitter associated with the various embodiments of the phase-locked loop (PLL)

FIG. 8 is a frequency versus time plot showing the reduction in jitter associated with the various embodiments of the phase-locked loop (PLL). In a traditional PLL, in frequency domain (labeled as $\Delta F_{TRADITIONAL}$, jitter 132 may have a higher magnitude (by a difference indicated by reference numeral 130 compared with the jitter 134 present in the PLLs described herein. By spreading the phase error and therefore the phase error correction over a pre-determined amount of time instead of doing it in just the original phase error time window, the overall frequency jitter is reduced.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary PLL, this exemplary PLL is presented merely to provide a useful reference in discussing various aspects of the invention. Of course, the description of the PLL has been simplified for purposes of discussion, and it is just one of many different types of appropriate PLLs that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the PLLs depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A phase-locked loop system comprising:
    a phase-frequency detector for generating an up signal or a down signal based on a phase difference between a reference clock and a feedback clock;
    a phase-error spreading circuit for generating phase-spread pulses based on a relationship between a first time attribute of the up signal or the down signal and a second time attribute of the phase-spread pulses; and
    a voltage-controlled oscillator (VCO) for generating a VCO clock based on the phase-spread pulses,
    wherein the phase-error spreading circuit comprises:
    a timing relationship analysis module configured to generate a digital indicia of the phase difference between the reference clock and the feedback clock; and
    a phase-spread pulses generator for generating the phase-spread pulses based on the digital indicia of the phase difference between the reference clock and the feedback clock, and
    wherein the phase-spread pulses generator comprises:
    a programmable ring oscillator for generating a counter clock;
    a pulse generation controller for generating a plurality of signals by comparing a count value to a plurality of predetermined values; and
    a pulse width weighted pulse generator for generating the phase-spread pulses based on the plurality of signals and the counter clock.

2. The phase-locked loop system of claim 1, wherein the timing relationship analysis module further comprises:
    a weighted delay chain comprising a plurality of buffers;
    a plurality of storage elements, wherein each of the plurality of storage elements is configured to store an output of one of the plurality of buffers in response to a delay capture clock; and
    a counter for generating the digital indicia of the phase-difference between the reference clock and the feedback clock based on an output of each of the plurality of storage elements.

3. The phase-locked loop system of claim 1, wherein the phase-error spreading circuit further comprises a pulse width register for storing the digital indicia of the phase difference between the reference clock and the feedback clock.

4. A phase-locked loop system comprising:
    a phase-frequency detector for generating an up signal or a down signal based on a phase difference between a reference clock and a feedback clock;
    a phase-error spreading circuit for generating phase-spread pulses based on a relationship between a first time attribute of the up signal or the down signal and a second time attribute of the phase-spread pulses; and
    a voltage-controlled oscillator (VCO) for generating a VCO clock based on the phase-spread pulses,
    wherein the phase-error spreading circuit comprises:
    a timing relationship analysis module configured to generate a digital indicia of the phase difference between the reference clock and the feedback clock; and
    a phase-spread pulses generator for generating the phase-spread pulses based on the digital indicia of the phase difference between the reference clock and the feedback clock, and
    wherein the timing relationship analysis module is configured to generate the indicia of the phase difference between the reference clock and the feedback clock such that the phase-spread pulses are spread over a time period greater than an active high time period of the up signal or the down signal.

5. The phase-locked loop system of claim 4, wherein a sum of active high time periods of the phase-spread pulses is approximately equal to the active high time period of the up signal or the down signal.

* * * * *